United States Patent [19]

Ceccherelli et al.

[11] Patent Number: 5,763,960
[45] Date of Patent: Jun. 9, 1998

[54] POWER SUPPLY CONTROLLED OPERATION SEQUENCING METHOD AND APPARATUS

[75] Inventors: John C. Ceccherelli, Wappingers Falls; Thomas M. Cowell, Poughkeepsie, both of N.Y.

[73] Assignee: International Business Machines Corporation, Armonk, N.Y.

[21] Appl. No.: 806,372

[22] Filed: Feb. 27, 1997

[51] Int. Cl.$^6$ .................................................. H01H 47/00
[52] U.S. Cl. .......................... 307/41; 307/38; 307/39; 307/130; 307/140; 327/209; 327/78; 327/546
[58] Field of Search .................................. 327/100, 185, 327/199, 208, 209, 74, 77, 78, 540, 545, 546, 530; 307/31, 38, 39, 41, 116, 125, 126, 130, 131, 139, 140

[56] References Cited

U.S. PATENT DOCUMENTS 5,136,181  8/1992  Yukawa .
5,565,807  10/1996  Ward .
5,587,684  12/1996  Salcedo .

Primary Examiner—Brian Sircus
Assistant Examiner—Peter Ganjian
Attorney, Agent, or Firm—M. A. Ehrlich

[57] ABSTRACT

A method and apparatus for sequencing the operation of electronic circuits based upon the level of the voltage provided by an external power supply. One or more power supply sequencer circuits may be interposed between an external power supply and one or more electronic circuits. The power supply sequencer circuits comprise a transistor having its high current node coupled to an external power supply, its controlling node coupled to a voltage sequencing means such as a diode and a resistor, wherein the resistor is in turn coupled to the external power supply and the diode is coupled to the ground potential. The transistor has its controlled high current node coupled through a power input node to the power input for the electronic circuit to condition the voltage received thereby. The power input node is in turn coupled through a second resistor to ground potential. The power sequencer circuits set a sequenced voltage level for transitioning the potential supplied to the electronic circuits from the ground potential to the operating potential of the power supply. Multiple versions of the power supply sequencers may be used to enable the sequential operation of an entire system during power supply transitions.

13 Claims, 3 Drawing Sheets

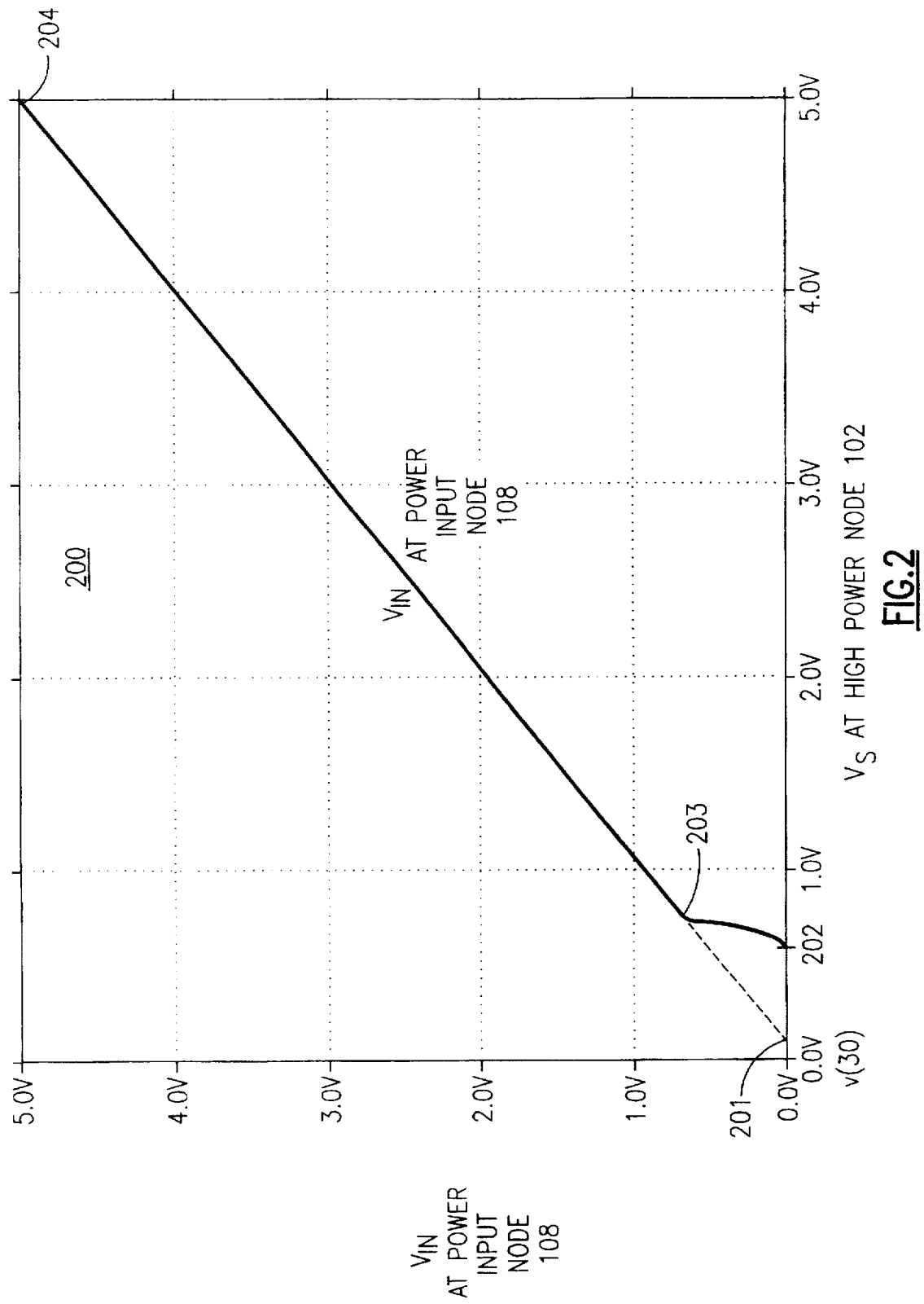

# 5,763,960

POWER SUPPLY CONTROLLED OPERATION SEQUENCING METHOD AND APPARATUS

CROSS REFERENCE TO RELATED APPLICATIONS

This application is related, and cross reference may be had to U.S. patent application entitled "Power Supply Control Circuit" by the present inventors, assigned to the present assignee and filed concurrently herewith as U.S. patent application Ser. No. 08/806,490.

FIELD OF THE INVENTION

This invention relates in general to the field of power supply control, and in particular to a power supply control circuit interposed between a supply voltage plane and the power supply pins of an electronic circuit for conditioning the electronic circuit's voltage at ground or operation voltage so as to permit the electronic circuit to receive a supply voltage at ground potential until the power supply transitions above a threshold voltage and thereafter to provide operation level voltage to the electronic circuit. Moreover, the power supply control circuit maintains the electronic circuit at operational voltage level until the power supply transitions below a threshold voltage and thereafter provides supply voltage equal to ground potential thereto. In a further application of the power supply circuit a delayed or sequenced power up and power down feature may be implemented among one or more electronic circuits.

BACKGROUND OF THE INVENTION

In most electronic designs, and particularly in subassembly circuit design, a circuit board is populated with a number of electronic circuits, each of which may be powered by a single voltage source, such as a power supply with a positive voltage potential referenced to a ground voltage potential. The electronic circuits populating the subassembly receive power from the voltage source which is turned on and off in accordance with the requisite usage for the subassembly. In practice, it is often necessary to condition the input voltage from the power supply to be received at the electronic circuits in order to ensure the proper functioning of the electronic circuits. For example, certain electronic circuit devices include self test circuitry which is operational, unless the supply voltage crosses a self test voltage threshold upon actuating the power source. If the self test threshold is set as a low voltage level, it is possible for the electronic circuit to experience certain residual voltage even after the power source is powered down. Thus, the voltage in the electronic circuit never falls below the self test threshold. In such instances, if the voltage for the electronic circuit cannot be forced to ground upon power down, it will enter its self test operation mode upon subsequent power up and consequently the electronic circuit and the subassembly will not function properly.

A number of prior art devices are directed at controlling or resetting such electronic circuits via the generation of a logic or reset signal which may or may not be based upon the power supply voltage level. These devices are not intended to solve the problem of controlling the voltage provided to the electronic circuits, rather, they are directed toward controlling the function of the electronic circuits by providing specialized logic signals to specialized circuitry in the electronic circuits which in turn controls the operation of the electronic circuit. For example, U.S. Pat. No. 5,136,181 to Yukawa describes a power on reset circuit which generates a high level signal as a reset signal to an external circuit independent of the ramping of the power supply voltage upon actuating the power supply. Thus, power management problems created as the supply voltage is in transition are not addressed by Yukawa. Other devices require external reference voltages to enable control of their associated electronic circuits, for example, U.S. Pat. No. 5,587,684 issued to Salcedo, teaches a power down circuit for use with battery operated devices which may be distributed to and incorporated into the electronic circuits of the devices. In the Salcedo patent, an externally applied reference voltage is to used to control the power components of an analog circuit such as a ADC or DAC. The externally applied reference voltage is compared against a threshold voltage to control power provision to various stages of the electronic circuit. The requirement of the externally applied reference voltage to generate logic to control power switching to the circuitry requires supply voltage be available to the logic circuitry in order to enable power management functions, thus Salcedo also fails to address the problem of managing power during power supply transition.

A further problem associated with typical electronic circuit designs occurs due to the need to sequence the power supplied to a number of electronic circuit devices during power transitions. For example, it may be necessary to keep a bus driver off of a multiport bus during power-on transitions to avoid contention problems, or to prevent control circuits from accessing a peripheral logic circuit until the power supply has achieved a predetermined value. The ability to sequence the performance of operations based upon the power supply voltage is a more flexible solution than reliance on fixed timing sequences. Moreover, with such a power management feature, it is possible to sequence the operation of multiple electronic circuits based upon the power supply voltage or power supply ramp rate. Such a feature could be used in power critical applications such as portable computers. The voltage based multiple sequencing inherent in such a power management scheme would allow various sections of a machine to be selectively powered on or off which would be useful for standby conditions without requiring a specialized power supply control circuit.

U.S. Pat. No. 5,565,807 to Ward teaches a "power-up circuit" for delaying the application of electrical power at power up until the voltage level available to the extended circuitry is acceptable, however, the power up circuit taught by Ward is merely a mechanism for generating a power up signal $V_{pu}$ for energizing the output enable circuitry of an extended integrated circuit component, and as such does not provide voltage directly from the power source to the extended circuits. In particular, Ward teaches use of a circuit comprising two power up branches, with the second of the two branches operating to isolate the circuit, when operating, from $V_{cc}$ fluctuations. Moreover, Ward cannot eliminate the residual voltage $V_{sat}$ which is provided to the circuits as $V_{out}$, a value described as typically less than 1.0 volts. Thus, Ward fails to address the previously described problem of improper operation of components which are not forced to ground prior to power up. Finally, since Ward implements a hysteresis loop for actuating different power up and power down thresholds for output enable circuitry, the circuitry required is more extensive and increases the cost and power consumption beyond what would be optimal for an efficient power management system.

SUMMARY OF THE INVENTION

The foregoing problems and shortcomings of the prior art are overcome and additional advantages provided by the present invention wherein a power supply control circuit enables the conditioning of an electronic circuit's voltage at ground or operation voltage so as to permit the electronic circuit to receive a supply voltage at ground potential until the power supply transitions above a threshold voltage and thereafter to provide operation level voltage of the power supply to the electronic circuit. Moreover, the present invention enables the sequencing of operations among electronic circuits based upon the power supply voltage or power supply ramp rate, without reliance on dedicated timing elements.

In accordance with the present invention a power supply control circuit is disclosed including a transconducting device such as a P channel MOSFET having a high current node coupled to an external power supply, a controlling node coupled to a voltage reference means, which may be done, for example, by coupling the controlling node to a node between a voltage reference device such as a diode and a resistor, wherein the resistor is in turn coupled to the external power supply and the diode is coupled to the ground potential. The transconducting device has its controlled high current node coupled through a power input node to the power input for the electronic circuit to condition the voltage received thereby. The power input node is in turn coupled through a pull down means such as a resistor to ground potential.

In operation the foregoing inventive apparatus may be interposed between a power supply and an electronic circuit such that the electronic circuit will experience a ground potential input at the power input while the power supply is powered on and will continue to experience ground potential input until a reference voltage set by the voltage reference means has been achieved. Thereafter the input voltage for the electronic circuit will quickly ramp to the operational voltage of the power supply (i.e. $V_{dd}$). Furthermore, when the power supply is powered down below the reference voltage, the input voltage for the electronic circuit will quickly fall back to the ground potential. With such an implementation, an embodiment of the inventive apparatus would enable the proper power transitions for components having voltage critical operating modes such as self-test or power on reset features, requiring the travseral of a specific low or high voltage threshold.

In a further embodiment of the invention, the inventive apparatus may be interposed between a power supply and electronic circuit having a voltage sensitive operation threshold. For example, the circuit may be interposed between a power source and a peripheral logic circuit for a microprocessor. In such an embodiment it may be necessary to ensure that the peripheral component is energized to a predetermined power level before interacting with the microprocessor. By setting the voltage reference level appropriately, the present invention permits the proper sequencing of such operations to ensure that the so-energized component functions properly.

In still a further embodiment of the invention, successive versions of the inventive power supply control circuit may be interposed between different sections of an entire machine such as a computer system. In such an embodiment, each of the successive versions of the control circuit may be set at different reference voltages corresponding to the sequence in which each section of the machine is to be energized and powered off. For example, in an exemplary computer system, the I/O section of the machine may be coupled to the power supply through a control circuit which enables the I/O components to be powered down when the supply falls below 4.0 volts, and the peripheral components may coupled to the supply via a control circuit which enables their shut down as the power supply transitions below 3.6 volts, and so on. In this embodiment, the inventive control circuit would provide for effective power management across a computer system while providing power efficient responses to various standby conditions typically experienced in the operation of such systems.

BRIEF DESCRIPTION OF THE DRAWINGS

The subject matter which is regarded as the invention is particularly pointed out and distinctly claimed at the conclusion of this application. The foregoing as well as other features and advantages of the invention will be apparent via the following detailed description taken in conjunction with the accompanying drawings, in which:

FIG. 2 graphically illustrates the operation of the exemplary embodiment of the inventive power supply control circuit, as the power supply transitions between its active and inactive states illustrating the voltage at the electronic circuit power input node as a function of power supply voltage;

DETAILED DESCRIPTION OF THE PREFERRED EMBODIMENT OF THE INVENTION

Figure 1:
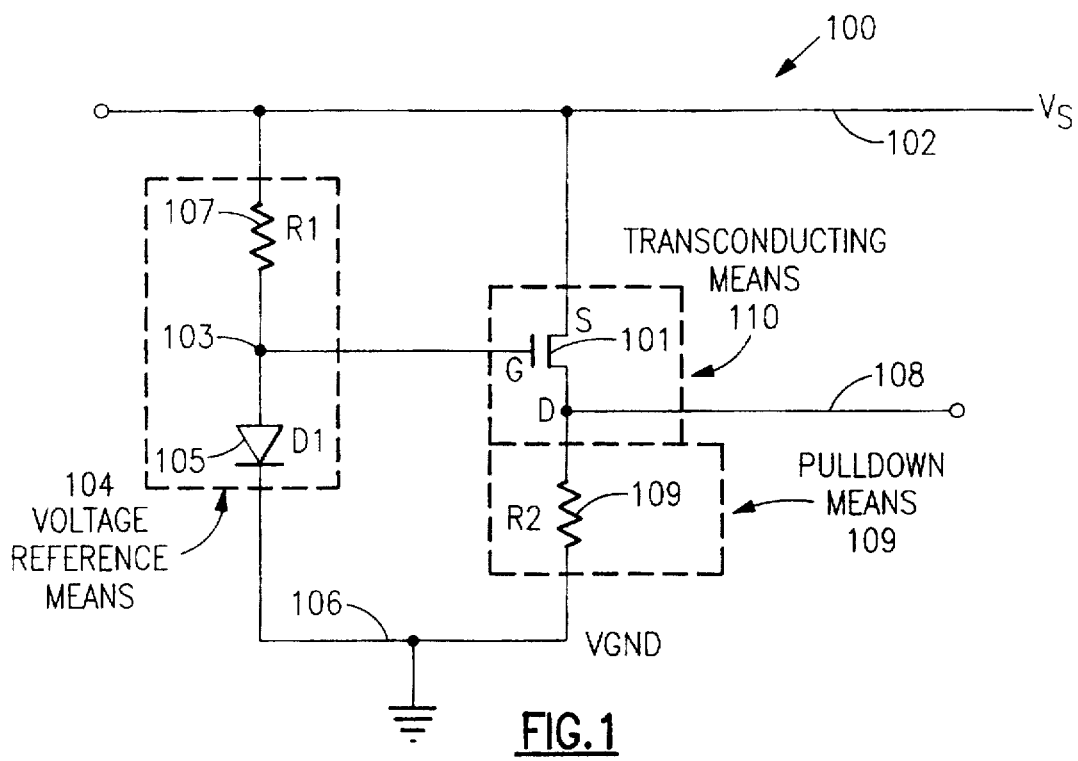
FIG. 1 illustrates an exemplary embodiment of the inventive power supply control circuit.

Turning now to our invention in greater detail, reference may be had to FIG. 1 wherein is illustrated an exemplary embodiment of the power supply control circuit 100. The exemplary power supply control circuit 100 includes a transconducting means 110 which in a preferred embodiment may take the form of a P channel MOSFET 101 which in operation serves alternately to couple and decouple the power input of an electronic circuit (not illustrated) to an external power supply voltage potential. Although the present invention is described via reference to a P channel MOSFET 101, it would be readily apparent to one of skill in the art to substitute a PNP bipolar transistor to serve as the transconducting means 110 which would achieve substantially similar results as the P channel MOSFET 101. Moreover, other transistor devices such as an N channel MOSFET or an NPN bipolar transistor may be utilized but would require further circuitry than described in the preferred embodiment.

The transconducting means 110 is coupled, via its high current node (which would equate to the source node of the P channel MOSFET), to the high voltage rail 102 which carries the voltage $V_s$ supplied by an external power source (not illustrated). The controlling node (which equates to the gate node of the P channel transistor 101) is coupled to a voltage reference means 104. The voltage reference means 104 is operative in setting a threshold voltage for the power supply control circuit 100 for determining when the external power supply voltage $V_s$ is to conduct across the transconducting means 110 so as to present the external power supply voltage $V_s$ at the power supply input node 108 of the electronic circuit coupled to the power supply control circuit 100, as well as when the external power supply voltage $V_s$ is not to conduct, so as to ensure that the ground potential is presented to the power supply input node 108 of the electronic circuit. Thus, the transconducting means 110 serves to switch the input potential of the electronic circuit between the operating power supply potential $V_s$ from the high voltage rail 102 and the ground potential $V_{gnd}$ from the ground plane 106.

In a preferred embodiment, the voltage reference means 104 comprises a voltage reference node 103 coupled to a diode D1 105 which connects to the ground plane 106, and to a resistor R1 107 which in turn couples to the high voltage rail 102. The diode D1 may be forward biased upon application of a particular voltage level developed from $V_s$ through the resistor R1 107. For illustrative purposes, a typical diode may be forward biased upon the application on 0.7 volts thereby maintaining the voltage reference node 103 at 0.7 volts. The controlling node of the transconducting means 110 couples to the voltage reference node 103.

The controlled high current node of the transconducting means 110 (which equates to the drain node of a p channel transistor 101) is coupled to the power input node 108 of the electronic circuit for switching the voltage potential at the input of the electronic circuit. The power input node 108 is further coupled to a pull down means 111 which in a preferred embodiment may take the form of a second resistor R2 109 which is in turn coupled to the ground node 106. The resistor R2 109 functions to pull the input voltage node 108 to the ground potential $V_{gnd}$ when the transconducting means 110 is not conducting. In practice the value of resistor R2 109 should be chosen so as to dissipate any voltage at the power input node 108, when the transconducting means 110 is not conducting, but not to interfere with the development of the potential at the power input node 108 while the transconducting means 110 is conducting. Furthermore, it will be apparent to the ordinarily skilled artisan that other means for achieving ground potential at the power input node while the transconducting means is not conducting may be incorporated herein. For example, a second transconducting element may be substituted for the resistor R2 109, so as to be turned on as the transconducting means 110 is shut down, thereby coupling the power input node 108 to the ground plane 106. Inclusion of such second transconducting means such as a depletion mode N channel MOSFET for the power down means 111 would require an additional circuit to drive the second transconducting device.

FIG. 2 graphically illustrates the operation of the power supply control circuit 100. In particular, the graph 200 illustrates the potential at the power input node 108 as a function of the external power supply voltage developed at the high voltage rail 102, as the external power supply transitions between its active and inactive states 200. As can be seen by reference to FIG. 2 the power supply control circuit 100 effectively ensures that the power input node 108 experiences ground potential $V_{gnd}$ or 0 volts 201 until the external power supply traverses a threshold voltage level 202. Subsequent to traversing the threshold voltage level the power input node 108 voltage potential ramps 203 at approximately the same rate as the external power supply until the maximum operating voltage thereof (i.e. 5 volts for example) 204 has been achieved. Likewise, as the voltage supplied by the external power supply is ramped downwards, the potential experienced by the power input node 108 is equivalent to that supplied by the downward ramping external power supply as provided on the high voltage rail 102 until a threshold voltage is reached at 203 after which the power input node 108 is quickly ramped to the ground potential $V_{gnd}$ at 202. At the ground potential the power input node 108, which is coupled to the ground plane 106 through the pull down means 111, is immune from residual voltage.

In operation the power supply control circuit 100 functions as follows: When the external power supply is powered on from an inactive state, the high voltage rail 102 initially delivers 0 volts. At this point, the voltage drop across the first resistor R1 107 is 0 volts and the potential at both the gate node and the source node of the P channel MOSFET 101 is 0 volts. Since $V_{gs}$ is equal to 0 volts the transistor does not conduct, and consequently it decouples the power input node 108 from the high voltage rail 102, and the potential at the power input node 108 is pulled to $V_{gnd}$ through the action of the pull down resistor R2 109 coupling the power input node 108 to the ground plane 106. As the voltage provided from the external power supply on the high voltage rail 102 $V_s$ begins to increase, the voltage developed at the source node of the P channel MOSFET 101 increases accordingly. Likewise, the voltage developed across the pull up resistor R1 107 serves to pull the voltage reference node 103 up to the external power supply voltage $V_s$ at the high voltage rail 102. When the voltage developed at the voltage reference node 103 reaches the forward bias voltage of the diode D1 105, the diode begins to conduct, effectively clamping the voltage reference node 103 to the reference voltage equivalent to the forward bias voltage of the voltage reference means 104. By reference to FIG. 2 this voltage would be the threshold voltage 202 after which the potential at the power input node 108 is ramped up from the ground potential $V_{gnd}$. In alternative embodiments of the invention the threshold voltage at which the voltage reference node 103 is to be fixed may be fine tuned by various means including without limitation the stacking of multiple diodes to augment the forward bias voltage of the voltage reference means 104 or alternatively, by replacing the single diode D1 105 or multiple stacked diodes with a zener diode to accomplish a similar result. Such means for creating a fixed reference voltage at a node in a circuit are well known to those of ordinary skill in the art, and as such need no further treatment herein to provide an understanding of the present invention.

As the voltage from the external power supply $V_s$ increases beyond the threshold voltage point (i.e. 202 in FIG. 2), the voltage at the gate node of the P channel MOSFET remains fixed, and the voltage at the source node of the transistor 101 rises with the high voltage rail 102, thus the gate to source voltage $V_{gs}$ of the P channel MOSFET 101 begins to rise. As the $V_{gs}$ potential rises, the transistor begins to conduct.

Before the P channel MOSFET 101 begins to conduct, the resistance between the source node and drain node is high enough so as to effectively decouple the power input node 108 from the high voltage rail 102. Since the power input node 108 is not coupled to the high voltage rail 102, the potential at the power input node 108 is driven to ground potential $V_{gnd}$ through the pull down resistor R2 109 coupled to the ground plane 106. As the P channel MOSFET 101 begins to conduct, the source to drain resistance drops at a rate governed by the ramp rate of the external power supply as presented on the high voltage rail 102, and the power input node 108 is driven to the potential $V_s$ of the high voltage rail 102 (i.e. point 203 in FIG. 2). Thus, the rate of transition between the ground potential and the potential of the external power supply, for the power input node 108, is controlled by the change in the gate to source potential $V_{gs}$, which in turn is controlled by the ramp rate of the external power supply. Since the transition period (i.e. the period between points 202 and 203 in FIG. 2) is controlled by the ramp rate of the power supply as multiplied by the gain of the transconducting means 110, the choice of the external power supply may provide for an extremely fast transition between the two potentials both when the power supply is ramping up or down. During ramp up, the potential at the power input node 108 will continue to rise with the high voltage rail 102 potential until the external power supply has reached its maximum operating voltage (for example 5 volts or point 204 in FIG. 2).

When the external power supply is powered down, the voltage on the high voltage rail 102 begins to ramp down from point 204. Initially, the voltage reference node 103 remains fixed at the threshold voltage (i.e. 0.7 volts) and the gate to source potential $V_{gs}$ remains above the conduction threshold for the P channel MOSFET 101 so that the power input node 108 potential mirrors the potential developed across the high voltage rail 102. Eventually, as the power supply voltage continues to fall, the high voltage rail 102 potential, and consequently the P channel MOSFET 101 source node potential falls to a level which causes the P channel MOSFET 101 to cease to conduct. At this point the source to drain resistance of the P channel MOSFET 101 begins to quickly rise until the high voltage rail 102 is ultimately decoupled from the power input node 108 at point 202. Thereafter, the potential at the power input node is driven to $V_{gnd}$ through the action of the pull down resistor R2 109 coupled to the ground plane 106.

Accordingly, the power supply control circuit 100 ensures that the potential developed at the power input node 108 of the electronic circuit alternates from the potential of the ground plane 106 to the potential of the high voltage rail 102. The power supply control circuit 100 further provides for a rapid voltage ramp rate between the two potentials as can be seen in the rapid transition between points 202 and 203 in FIG. 2. The power supply control circuit 100 may be utilized to condition the input voltage to electronic circuits having voltage sensitive operation modes. In particular, an embodiment of the present invention may be employed to condition the input voltage supplied to an electronic circuit such as the Cypress Semiconductor VME bus controller, part number CY7C961. The Cypress component employs internal circuitry to provide a reset to all latch states which control logic function. This reset circuit is triggered by the transition of the component power source through some voltage threshold between ground and the positive operational supply voltage for the component. For the particular Cypress component this threshold was less than 0.2 volts. When this component is used in a system providing a power source which doesn't drop below 0.2 volts in the off state, an unsuccessful power on reset results. Also, with this component, a scan mode could be entered on power up which could not be reset by some logic input reset signal, but only by a successful power on reset. Therefore, without the successful power on reset the component was non-functional as a VME bus controller. The interposition of the present inventive power supply control circuit 100 between the external power supply and the Cypress component ensures that it receives ground potential $V_{gnd}$ when the external power supply voltage falls past the point of conduction for the P channel MOSFET 101, (i.e. point 202 on FIG. 2) thereby ensuring the successful power on reset of the component.

Figure 3:
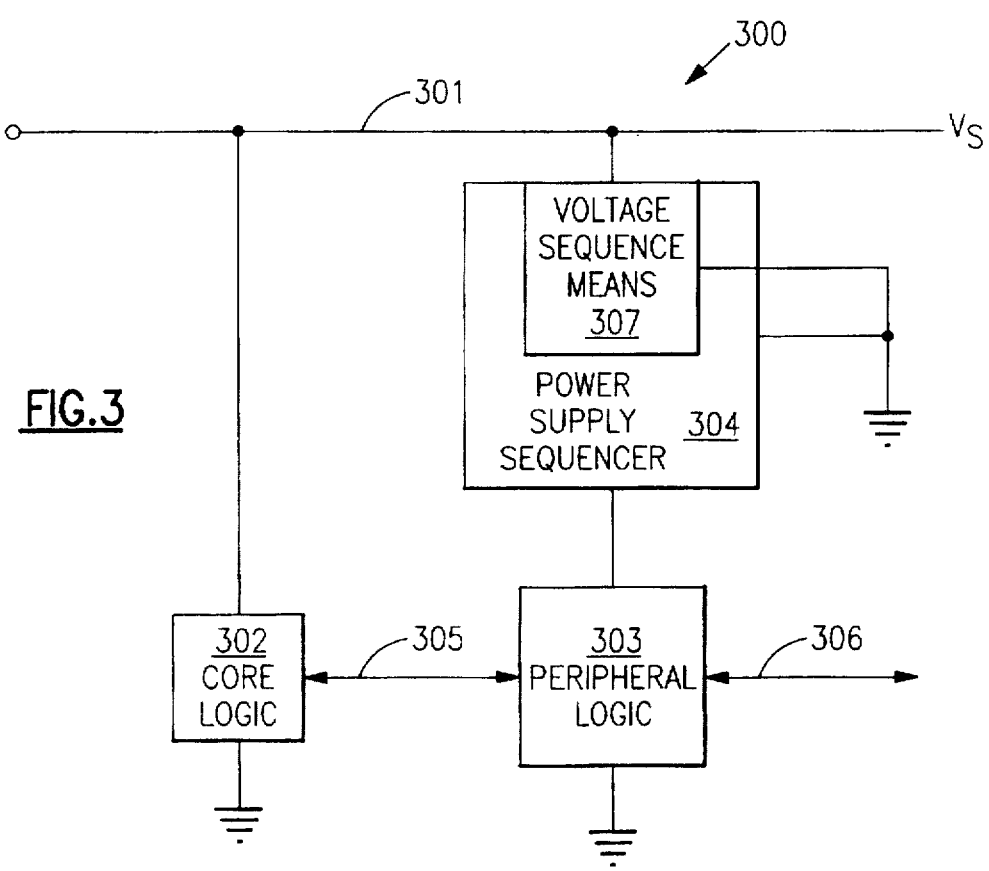
FIG. 3 depicts an exemplary embodiment of the inventive power supply control circuit interposed between the power supply and a device requiring voltage sensitive sequencing.

FIG. 3 illustrates an alternate embodiment of the invention wherein the operation of a particular electronic circuit is sequenced based upon the input voltage level. In such an embodiment, the external power supply voltage must reach a specific predetermined level to ensure the proper operation of a given system. For example, via reference to FIG. 3 the relevant portion 300 of an electronic system is depicted with an external power supply providing voltage $V_s$ on a high voltage rail 301. The high voltage rail 301 is coupled to a core functional logic block 302 which may comprise, without limitation, a microprocessor and associated control logic. The core functional logic 302 is coupled to, and in communication with a peripheral logic block 303 which may comprise communication devices such as an output transceiver, which may communicate with the remainder of the electronic system by sending and receiving signals over bus 306. The peripheral logic block 303 is coupled to the high voltage rail 301 through the power supply sequencing circuit 304 which comprises circuitry substantially in accordance with that of FIG. 1. The power supply sequencing circuit 304 further comprises a voltage sequencing means 307 in place of the voltage reference means 104 of the power supply control circuit 100. The voltage sequencing means enables the clamping of a sequenced voltage level at the voltage reference node 103 so as to ensure that the P channel MOSFET 101 will conduct only after the requisite voltage has been developed across the high voltage rail 301.

Assuming that the core functional logic block 303 will generate reliable output signals over bus 305 to the peripheral logic 303 when the input voltage thereto has risen to approximately 3.5 volts, it would be desirable to inhibit communications between the devices 302 and 303 and to inhibit the output of the peripheral logic 303 over bus 306 which couples the illustrated portion of the assembly 300 to the remainder of the system, prior to the development of at least 3.5 volts at the high voltage rail 301. Likewise, it would be further advantageous to shut down the operation of the portion 300 of the assembly upon experiencing a supply voltage drop below 3.5 volts on the high voltage rail 301 so as to ensure operation integrity.

By adjusting the sequence threshold of the power supply sequencer's voltage sequencing means 307 to be, for example, 4 volts, it is possible to inhibit the functioning of the assembly 300 until 4 volts is developed across the high voltage rail 301. Likewise, such a circuit would enable the shut down of the already operational system should the voltage developed across the high voltage rail fall below 4 volts. In practice, the circuit comprising the power supply sequencer would be analogous to that of FIG. 1, however, in this embodiment, the voltage sequencing means 307 would comprise means for forcing the P channel MOSFET 101 to conduct only after 4 volts have developed across the high voltage rail 102. For example, by replacing the diode D1 105 with a 3.6 volt zener diode so as to clamp the reference voltage node 103 at 3.6 volts, the P channel MOSFET will conduct at approximately $V_s$=4 volts thereby coupling the peripheral logic 303 to the high voltage rail 301 causing the peripheral logic 303 to begin to function only at or above 4 volts. Moreover, if the external power supply voltage provided across the high voltage rail 301 were to fall below 4 volts the P channel MOSFET 101 would quickly cease to conduct and the voltage at the power input node 108 of the peripheral logic 303 will be driven through the pull down resistor R2 109 to the ground potential $V_{gnd}$ of the ground plane 106. In this manner, the operation of the peripheral logic 303 (and consequently the subassembly 300) is sequenced based upon the power supply voltage via the present inventive means so as to inhibit operation of the portion 300 of the assembly until after the appropriate voltage has been achieved, thereby ensuring reliable performance of the system while additionally providing a mechanism to shut down the operation thereof should the voltage fall below 4 volts.

In a manner similar to that depicted in FIG. 3, the operation of an entire system may be sequenced based upon the level of the voltage provided by an external power supply. In such a system, the portions of the system which are not integral to the overall function, such as I/O drivers and peripherals, may be conditioned via the application of one or more power supply sequencers so as to be enabled and disabled upon development of voltage levels at or near operational voltage (i.e. 5 volts for example) across the high voltage rail. Conversely, vital portions of the system, upon whose continual availability the integrity of the system depends, may be conditioned via application of one or more different power supply sequencers to have a much lower enable-disable threshold so as to be operative through a wider range of power conditions, such as may be experienced in various computer system stand-by modes.

Figure 4:
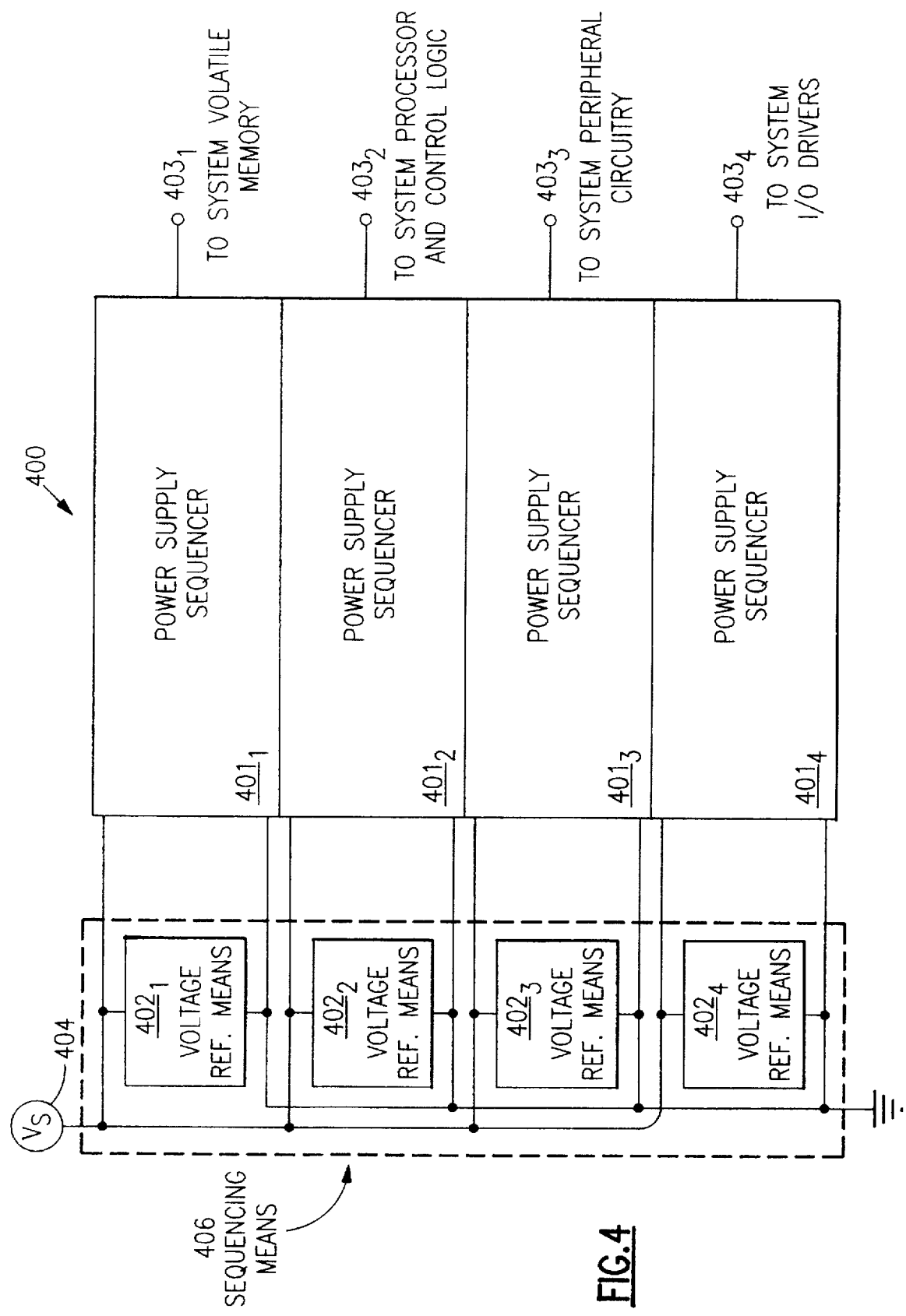
FIG. 4 represents an embodiment of the power supply control circuit wherein successive versions of the inventive control circuit, each having unique sequenced voltage thresholds, are implemented to enable the voltage dependent sequencing of an entire system.

Turning now to FIG. 4, a power supply multiple sequencing apparatus 400 for an entire system which is sequenced via the application of the successive versions of the power supply sequencers $401_1$–$401_4$ to various portions of the system is illustrated. Each of the power supply sequencers $401_1$–$401_4$ is similar in organization to the power supply control circuit 100, and in a manner similar to that of the voltage reference means 104 thereof, each of the power supply sequencers $401_1$–$401_4$ is associated with a voltage reference means $402_1$–$402_4$, each coupled between the high voltage rail 404 and the ground plane 405, each sets a different sequenced voltage for biasing each of the P channel MOSFETs 101 in the power supply sequencers $401_1$–$401_4$. FIG. 4 by way of illustration, depicts a multiple sequencing apparatus 400 including four power supply sequencers $401_1$–$401_4$, however it will be understood that any number of such power supply sequencers may be included in the present inventive multiple sequencing apparatus 400, for coupling and decoupling the external power supply to as many associated subassemblies of the particular system as is dictated by the efficient power management thereof. The power supply sequencers $401_1$–$401_4$ are coupled to the high voltage rail 404 for receiving supply voltage $V_s$ from an external power source (not illustrated) and to the ground plane 405 for presenting the ground potential $V_{gnd}$ to the various coupled portions of the system $403_1$–$403_4$. The power supply sequencers $401_1$–$401_4$ are additionally coupled via nodes $403_1$–$403_4$ to various portions of an entire computer system wherein the sequenced voltage associated with each version of the sequencers corresponds to the operating voltage requirements for the particular associated portion of the system. In this manner a computer system design can compensate for operating voltage fluctuations likely to be encountered by the system.

In terms of functionality, the multiple sequencing apparatus 400 may be viewed as comprising two functional elements. The power supply sequencing circuits $401_1$–$401_4$ include transconducting means 110 for coupling and decoupling the multiple electronic circuits (via nodes $403_1$–$403_4$) to the external power supply via the high voltage rail 404 and to the ground potential via the ground plane 405. Thus, the power supply sequencers $401_1$–$401_4$ function to couple and decouple the electronic circuits to the system rails. The sequencing function of the apparatus is enabled via the plurality of voltage reference circuits $402_1$–$402_4$ which may be viewed as the sequencing means 406 for the apparatus 400. Each of the voltage reference means sets a unique sequenced voltage level for enabling the associated power supply sequencer to couple or decouple the associated electronic component to the external power supply or to the ground plane. Thus, the sequential operation of the plural electronic circuits is realized as the operating voltage potential of the external power supply is altered, the sequence being determined by the sequenced voltage thresholds set by the voltage reference means. The temporal relationship of the coupling and decoupling function of each of the power supply sequencers $401_1$–$401_4$ is governed by the sequenced voltage levels set by the sequencing means 406 in each of the associated voltage reference means $402_1$–$402_4$ in conjunction with the ramp rate of the external power supply. In particular, the temporal relationship between the activation or deactivation of the coupled electronic circuits is predicated solely on the transition time of the external power supply between the unique sequenced voltage thresholds set by each of the voltage reference means comprising sequencing means 406, whereas the order of activation or deactivation is dependant solely upon the unique sequenced voltage thresholds.

For example, and by reference to the exemplary illustration in FIG. 4. Power supply sequencer $401_1$ by way of voltage reference means $402_1$ may set a sequenced voltage threshold at the lowest possible voltage at which the system is to operate, for example 2.2 volts. In this manner, the circuitry connected to the power supply sequencer $401_1$ would be actuated over the widest range of voltages (i.e. 2.2 volts through 5 volts). The portion of the system connected to power supply sequencer $401_1$ would ideally be the portion of the system for which operation is required over the broadest range of power supply conditions. In an exemplary system it might therefore be expected that power supply sequencer $401_1$ would be coupled via node $403_1$ to the volatile memory portion of the system, so as to ensure the integrity of the data stored in these registers over the widest possible range of voltages received by the system. Moreover, power supply sequencer $401_2$, by way of voltage reference means $402_2$ may, for example, set a sequenced voltage threshold at 3.3 volts for coupling the external power supply from the high voltage rail 404 and the ground potential from the ground rail 405 to the system processor and associated processor control logic via node $403_2$. In this manner the processor and associated control logic will receive power from the power supply at a voltage range between 3.3 and 5 volts. Likewise, power supply sequencer $401_3$, by way of voltage reference means $402_3$ may, for example, set a sequenced voltage threshold at 3.6 volts for coupling the external power supply from the high voltage rail 404 and the ground potential from the ground rail 405 to the system's peripheral circuitry via node $403_3$. In this manner the peripheral circuitry receives power from the external power supply at voltages between 3.6 volts and 5.0 volts. Finally, power supply sequencer $401_4$, by way of voltage reference means $402_4$ may set a sequenced voltage threshold at 4.0 volts for coupling the external power supply from the high voltage rail 404 and the ground potential from the ground rail 405 to the system I/O drivers via node $403_4$. Accordingly, the I/O drivers receive power from the external power supply at voltages between 4.0 volts and 5.0 volts.

Prior to powering up such a system, the external power supply provides 0 volts across the high voltage rail 404, so that none of the power supply sequencers $401_1$–$401_4$ may cause their P channel MOSFETs 101 to conduct. Consequently, the input nodes $403_1$–$403_4$ for each of the subsystems are maintained at the ground potential $V_{gnd}$ by coupling to the ground plane 405 through the pull down resistor R2 109. Upon power up, the voltage across the high voltage rail 404 begins to rise, until the first voltage sequenced threshold set by the first voltage reference means $402_1$ (i.e. 2.2 volts) is achieved. At this point, the voltage reference means $402_1$ for the first power supply sequencer $401_1$ sets the sequenced voltage at the voltage reference node 103 and the P channel MOSFET 101 included therein begins to conduct thereby providing the potential at the high voltage rail 404 to the input node $403_1$ for the volatile memory for the system. Consequently, upon the external power supply ramping to 2.2 volts, the exemplary multiple sequencing apparatus 400 provides operating voltage to the volatile memory subsystem of the associated computer system while decoupling all other systems from the high voltage rail 404 and maintaining them at the ground potential $V_{gnd}$. As the externally supplied voltage continues to rise, the successive power supply sequencers $401_2$–$401_4$ each in turn couple their respectively connected $403_2$–$403_4$ subsystems to the high voltage rail 404. Thus at 3.3 volts the system processor and associated processor control logic begins to receive operating voltage over the node at $403_2$, but only after the volatile memory which services the system processor has been made operational by receiving operating voltage from the external power supply over node $403_1$. Subsequently, as the power supply ramps up to 3.6 volts the peripheral logic circuitry is actuated over node $403_3$, but only after the processor and processor control logic which generates the control signals for operating the peripheral circuitry has been energized. In a like manner, as the power supply rises past 4.0 volts the I/O drivers are actuated via the node at $403_4$, but only after the peripheral circuits which communicate with the system's I/O drivers have been turned on by voltage provided over node $403_3$. In this manner it can be seen that the multiple sequencing apparatus 400 enables the sequential power up of the various subassemblies comprising a computer system based upon the sequenced voltage thresholds and the power supply voltage ramp rate, so as to energize each subassembly in the order dictated by the operation of the system.

When a system incorporating the inventive multiple sequencing apparatus 400 is to be powered down, the multiple sequencing apparatus ensures that the sequence of shut down operations proceeds in the order dictated by the operation of the system. For example, and by reference to FIG. 4 as the external power supply voltage across the high voltage rail 404 falls below 5.0 volts each of the power supply sequencers $401_1$–$401_4$ includes a conducting P channel MOSFET 101, and accordingly each of the subassemblies of the attached computer system receives the operating voltage $V_s$, from the high voltage rail 404 via their associated input nodes $403_1$–$403_4$. As the potential on the high voltage rail 404 falls below 4.0 volts, the source node potential for the P channel MOSFET 101 included in power supply sequencer $401_4$ is equivalent to the gate potential as set by the voltage reference node 103 fixed via voltage reference means $402_4$ to 4.0 volts, thus $V_{gs}$=0 volts and the P channel MOSFET ceases to conduct, decoupling the input node $403_4$ from the high voltage rail 404 and driving it to the ground potential $V_{gnd}$ through the pull down resistor R2 109 coupled to the ground plane 405. In this manner, as the system is powered down to below 4.0 volts, the computer system I/O drivers connected to the multiple sequencing apparatus 400 via node $403_4$ are disabled. As the power supply voltage continues to fall, the successive power supply sequencers $401_3$–$401_1$ respectively, each decouples the high voltage rail from its associated system input node $403_3$–$403_1$. Thus, as voltage across the high voltage rail 404 falls below 3.6 volts, the node $403_3$ is decoupled from the high voltage rail 404 thereby disabling the system's peripheral circuitry, only after the I/O drivers with which they communicate have previously been turned off. Likewise, as the potential across the high voltage rail falls below 3.3 volts the node $403_2$ is decoupled from the high voltage rail 404 via the power supply sequencer $401_2$ thereby disengaging the system processor and associated control logic only after the peripheral circuitry has been deactivated. Finally, after the potential on the high voltage rail 404 falls below 2.2 volts, the node $403_1$, is decoupled via the power supply sequencer $401_1$, thereby shutting down the system volatile memory only after the processor which accesses the volatile memory has been deactivated.

From the foregoing description it is clear that the multiple sequencing apparatus 400 enables the sequential application of the power supply voltage to the various subassemblies comprising a computer system, in an order commensurate with the proper interoperation of the subassemblies of the computer system. The timing of sequencing operation is based entirely on the ramp rate of the external power supply and requires no independent timing circuitry such as delay or RC circuits. Furthermore, it is contemplated herein that the present inventive multiple sequencing apparatus 400 may be packaged as an integrated circuit component so as to provide for ease of implementation in already existing computer systems.

Implementation of the multiple sequencing apparatus 400, would prove particularly useful in power critical applications such as "green" computer systems or portable battery-based computer systems wherein the system design focuses on limiting power consumption. In such systems, it is common to provide a series of power down levels which are implemented as a result of system inactivity. For example, a laptop computer such as an IBM Thinkpad computer (IBM and Thinkpad are registered trademarks of International Business Machines Corporation) or a desktop computer such as an IBM Aptiva personal computer (Aptiva is a registered trademark of International Business Machines Corporation) including advance power management features, may be configured to begin powering down certain subsystems based upon a certain period of system inactivity. When the user or an application program subsequently issues a request for the system, the computer will resume processing, by quickly restoring the system's operative state the state which existed prior to entering the standby mode. Such power management features including scheduling, wake up on ring, and rapid resume are available on many computer systems and are well known to those of skill in the art. By incorporating the present multiple sequencing apparatus 400 in such computer systems, it is possible to sequence the application of supply voltage to, as well as the removal of supply voltage from the various portions of the computer system so as to, for example, maintain the integrity of data stored within the system's dynamic random access memory ("DRAM") while powering off drivers for the monitor, printer and the like to conserve power over prolonged periods of inactivity. Thus, the multiple sequenced embodiment 400 of the present invention may be used to efficiently implement advanced power management features in a computer system.

Though preferred embodiments have been depicted and described in detail herein, it will be apparent to those skilled in the relevant art, both now and in the future, that various modifications, additions, improvements and enhancements may be made without departing from the spirit of the invention, and these are therefore considered to be within the scope of the invention as defined in the following claims which should be construed to maintain the proper protection for the invention first disclosed.

Having described our invention, what we claim as new and desired to secure by Letters Patent is as follows:

1. A power supply multiple sequencing apparatus for sequencing the operation of a plurality of electronic circuits wherein voltage may be alternately provided to each one of the plurality of electronic circuits from an external power supply or a ground potential through said power supply multiple sequencing apparatus, said voltage further being sequentially provided to each of said plurality of electronic circuits in a predetermined order so as to enable the interoperation of the plurality of electronic circuits, and wherein the voltage provided to each of the plurality of electronic circuits may be rapidly transitioned between the operating voltage level of the external power supply and the ground potential, the power supply multiple sequencing apparatus comprising:

a plurality of power supply sequencers, wherein each of the power supply sequencers alternately couple and decouple the associated one of the electronic circuits to the external power supply or to said ground potential, wherein the coupling and decoupling respectively provides and removes operating power to the electronic circuits and wherein the coupling and decoupling is entirely dependent upon the operating voltage level of the external power supply; and a sequencing means for defining the order and the temporal relationship of the coupling and decoupling of each of the plurality of electronic circuits to the external power supply or said ground potential through the associated power supply sequencer, wherein said order is based entirely upon the operating voltage level of the external power supply and the temporal relationship is based entirely upon the transition time between successive operating voltage levels of the external power supply, the sequencing means coupled between said plurality of power supply sequencers and said external power supply and ground potential; and each of said plurality of electronic circuits being first coupled to the external power supply through the associated one of said plurality of power supply sequencers at a different operating voltage level for said external power supply.

2. A power supply multiple sequencing apparatus according to claim 1, wherein said power sequencers further include:

a transconducting device having a high current node coupled to a high power node for receiving said operating voltage potential from said external power supply, a controlling node for coupling to said sequencing means and a controlled high current node coupled to a power input node for coupling to said associated one of said plurality of electronic circuits; and a pull down means coupled between said power input node and said ground potential.

3. A power supply multiple sequencing apparatus according to claim 2 wherein said sequencing means further includes:

a plurality of voltage reference means, each of said plurality of voltage reference means coupled to an associated one of said plurality of power sequencers at said controlling node, each of said voltage reference means further coupled to the external power supply via said high power node, and coupled to the ground potential.

4. A power supply multiple sequencing apparatus according to claim 3 wherein each of said plurality of voltage reference means may be set by said operating voltage potential from said external power supply to fix each of said voltage reference means at a unique sequenced voltage level thereby setting said controlling node of said associated one of said transconducting devices at said sequenced voltage level, said sequenced voltage level being a voltage level at or above which the associated one of said electronic circuits will function reliably, and wherein the power input node may be alternately coupled and decoupled to the high power node through the transconducting device, said coupling occurring if said operating voltage potential rises above said sequenced voltage level and said decoupling occurring if said operating voltage potential falls below said sequenced voltage level, the order of the coupling and decoupling being defined by the unique sequenced voltage level set by each of the voltage reference means and the temporal relationship of the coupling and decoupling being defined by the unique sequenced voltage level set by each of the voltage reference means and the transition time between successive operating voltage levels of the external power supply.

5. A power supply multiple sequencing apparatus according to claim 4 wherein each of said plurality of voltage sequencing means includes a diode coupled to said ground potential and a resistor coupled between said diode and said high power node.

6. A power supply multiple sequencing apparatus according to claim 5 wherein each of said plurality of voltage reference means further includes, a voltage reference node situated between said diode and said resistor, said controlling node of said associated transconducting device coupling to said voltage reference node of said voltage reference means.

7. A power supply multiple sequencing apparatus according to claim 5 wherein said unique sequenced voltage level set by each of said voltage reference means is equal to the forward biased voltage of the diode.

8. A power supply multiple sequencing apparatus according to claim 4 wherein if said power input node for each of said power sequencers is coupled to said high power node, the potential at the power input node is substantially equal to the operating voltage potential of said external power supply at the high power node and if said power input node for each of said power sequencers is decoupled from said high power node, said power input node is pulled to the ground potential by the pull down means.

9. A power supply multiple sequencing apparatus according to claim 4 wherein if the unique sequenced voltage level set by each of said voltage reference means has been achieved, the rate of change in the voltage difference between the high current node of the associated transconducting device and the controlling node of the associated transconducting device, as multiplied by the gain of the associated transconducting device, determines the rate at which the power input node potential transitions between the ground potential and the operating voltage potential at the high power node.

10. A power supply multiple sequencing apparatus according to claim 2 wherein for each of said power sequencers, said pull down means is a resistor.

11. A power supply multiple sequencing apparatus according to claim 2 wherein for each of said power sequencers, said transconducting device is a P channel MOSFET.

12. A computer system including a power supply multiple sequencing apparatus according to claim 1 wherein each of the plurality of electronic circuits are computer subsystems and wherein the sequencing of the operations of each of the computer subsystems ensures the proper function of the computer system if the operating voltage potential of the external power supply changes.

13. A method for sequencing the operation of a plurality of electronic circuits wherein voltage is alternately provided to each of said plurality of electronic circuits from an external power supply or a ground potential through a power supply multiple sequencing apparatus, and wherein said alternately provided voltage may be at a ground potential or at an operating voltage potential of the external power supply, said voltage further being sequentially provided to each of said plurality of electronic circuits in a predetermined order so as to enable the interoperation of the plurality of electronic circuits, and wherein the voltage may be rapidly transitioned between the operating voltage potential and the ground potential, the method comprising the steps of:

- receiving the operating voltage potential of said external power supply at a sequencing means including a plurality of voltage reference means each of said voltage reference means coupling to one of a plurality of power supply sequencers at a controlling node of a transconducting device included in each of said power supply sequencers, each of said voltage reference means including a unique sequenced voltage level for sequencing the operation of an associated electronic circuit;

- receiving said operating voltage potential of said external power supply at a high current node for each of said transconducting devices;

- fixing the unique sequenced voltage levels via said plurality of voltage reference means at each of said coupled controlling nodes of said transconducting devices, if the operating voltage potential rises to said unique sequenced voltage levels;

- coupling said operating voltage potential from said external power supply to said electronic circuit associated with said voltage reference means via a controlled high current node of said transconducting device if said operating voltage potential rises above the unique sequenced voltage level for the voltage reference means; and

- decoupling said operating voltage potential from said external power supply from said electronic circuit associated with said voltage reference means and pulling the potential of the electronic circuit to the ground potential if said operating voltage potential falls below said unique sequenced voltage level for the voltage reference means.

* * * * *